(12) United States Patent
Martin

(10) Patent No.: US 9,991,142 B2
(45) Date of Patent: Jun. 5, 2018

(54) APPARATUS AND METHOD FOR DECAPSULATING PACKAGED INTEGRATED CIRCUITS

(71) Applicant: Kirk Alan Martin, Aptos, CA (US)

(72) Inventor: Kirk Alan Martin, Aptos, CA (US)

(73) Assignee: RKD Engineering Corporation, Scotts Valley, CA (US)

( * ) Notice: Subject to any disclaimer, the term of this patent is extended or adjusted under 35 U.S.C. 154(b) by 435 days.

(21) Appl. No.: 14/726,880

(22) Filed: Jun. 1, 2015

(65) Prior Publication Data
US 2015/0262850 A1    Sep. 17, 2015

Related U.S. Application Data

(62) Division of application No. 13/329,735, filed on Dec. 19, 2011, now Pat. No. 9,059,184.

(51) Int. Cl.
| H01L 21/306 | (2006.01) |
| H01L 21/67 | (2006.01) |
| H01L 21/3213 | (2006.01) |
| H01L 21/56 | (2006.01) |

(52) U.S. Cl.
CPC .. *H01L 21/67126* (2013.01); *H01L 21/32134* (2013.01); *H01L 21/56* (2013.01); *H01L 2924/0002* (2013.01)

(58) Field of Classification Search
None
See application file for complete search history.

(56) References Cited

U.S. PATENT DOCUMENTS

| 4,384,917 | A | * | 5/1983 | Wensink | H01L 21/67126 438/106 |
| 5,783,098 | A | * | 7/1998 | Martin | H01L 21/67075 156/345.18 |
| 5,855,727 | A | * | 1/1999 | Martin | H01L 21/67126 156/345.18 |
| 6,231,717 | B1 | * | 5/2001 | Goto | H01L 21/67126 156/345.11 |
| 2002/0144975 | A1 | * | 10/2002 | Lam | C04B 26/06 216/58 |
| 2015/0262850 | A1 | * | 9/2015 | Martin | H01L 21/56 156/345.15 |

\* cited by examiner

*Primary Examiner* — Sylvia R MacArthur
(74) *Attorney, Agent, or Firm* — Donald R. Boys; Central Coast Patent Agency, LLC

(57) ABSTRACT

A system for decapsulating a portion of an encapsulated integrated circuit that includes copper elements has one or more containers holding specific etchant solutions, a pump having an inlet port connected to the one or more containers holding specific etchant solutions, and an outlet port, a temperature-controlled metal block having a fluid inlet connected to the pump outlet port, and an outlet port from the block, and control circuitry enabling control of temperature of the metal block and operation of the pump, and flow and temperature sensors coupled to the control circuitry. Etchant temperature at the outlet of the metal block is controlled to be at or below ambient temperature by controlling the pump and temperature of the metal block, and etchant mixture is delivered via a delivery conduit to an encapsulation surface of an encapsulated integrated circuit, decapsulating a portion of encapsulated circuit, minimizing damage to the copper elements.

9 Claims, 3 Drawing Sheets

APPARATUS AND METHOD FOR DECAPSULATING PACKAGED INTEGRATED CIRCUITS

CROSS-REFERENCE TO RELATED DOCUMENTS

The instant application is a divisional application of co-pending U.S. application Ser. No. 13/329,735, filed Dec. 19, 2011 and claims priority to the effective filing date of that application. All disclosure of the parent application is incorporated in the instant application at least by reference.

BACKGROUND OF THE INVENTION

1. Field of the Invention

The present invention relates generally to decapsulation of plastic packaged integrated circuit devices, and pertains particularly to systems and methods for application of etchant materials for decapsulation.

2. Discussion of the State of the Art

Integrated circuits (ICs) function as discrete units and a populated printed circuit board (PCB) final assembly consists of many different types of ICs placed in close proximity. Such devices are often sourced and manufactured elsewhere and are packaged into individual segments with all of the delicate IC components protected within the individual packaging. Plastic encapsulation has been employed for years, typically utilizing epoxy or other plastic resin materials, which involves molding the protective material around the IC device itself, a central portion of lead frame, bonding wires or other connections between the contact pads on the device and the inner lead fingers on the lead frame.

It is clearly desirable that IC failure analysis be performed utilizing non-destructive testing procedures which leave the entire encapsulated package structure intact. However, visual inspection, testing, failure analysis and repair of such encapsulated devices most often require physical access to the packaged components and to the wire bonds, inner lead fingers and other connection circuitry thereof. In such cases decapsulation of the package, at least in part, is necessary to allow for exposure of the circuits of interest from their outer covering, which is a required first step of failure analysis.

Since the advent of IC plastic packaging, several techniques have been developed for removal of the protective material. One such technique, which is mechanical, is to grind the encapsulant back to a point to where the IC and connections are exposed, or the encapsulant may be cut along the sides. Another technique is plasma etching which involves precise application and causing the ionized particles of the plasma to react with the encapsulant material at high temperature, and then draining away the products of the etching process.

The above methods do have disadvantages however. For example, when using the mechanical grinding approach it is difficult to know precisely when to stop the grinding, and physical damage to connections within the package is highly possible. Plasma etching, while being very precise, is in many cases prohibitively expensive, and the fine control required can be cause for a prohibitively lengthy process as well.

Chemical processes that can remove the encapsulant material are generally preferred in the art. Chemical etching provides a balance of precision and cost effectiveness, and involves precise application of an acidic, heated corrosive substance, for example nitric acid and/or fuming sulfuric acid. The process may involve manual or automated jet application of the acid material. Jet etching is a delicate process which requires very careful application of the corrosive material. However, although precise and cost effective, the process does also have certain disadvantages as practiced in current state-of-the-art systems.

Various deficiencies have been encountered in many prior art systems for decapsulating packaged electronic devices. For example, decapsulation systems and methods have difficulty in controlling the desired amount of etching, prevention of damage to the package including interior copper or other metal wires and device metallization, and also the volume of acids required to perform the process. Further, although the use of nitric acid and sulfuric acids or mixtures of the two has been quite successfully used for decapsulating packaged ICs using aluminum metallization and gold or aluminum interconnects, this is not the case for decapsulating devices using the more recent copper metallization for interconnects. Nitric acid is effective at removing the mold compound of the encapsulant, but also removes the upper layer of copper die metallization and will damage the copper interconnect wires. In this case the top interconnect metallization layer is made unavailable for failure analysis. For example, one important test is the wire-to-pad bond test, well-known in the art as the wire pull and ball shear test. This test is performed at the upper metallization layer, and is impossible in the case of such copper metallization damage as a result of prior art etching systems and methods. Sulfuric acid presents the same difficulties.

Further problems exist in prior art systems for decapsulating packaged electronic devices by etching, in that external auxiliary heaters are typically used for heating of the etchant, which can cause a lack of precise maintenance of a select temperature of the etchant mix, etch head, and encapsulated electronic device There is also a problem of a lack of keeping etchant acid consumption low due to the absence of efficient etchant recycling processes. A particular slowness of the etching process exists due to the presence of non-reactive materials on the etch face, and there is inefficient removal of etching debris.

Therefore what is clearly needed is a system and method for decapsulating a packaged electronic device which provides for an efficient and economical etching process utilizing new and novel techniques involving precise temperature control at the etch head, reduced etchant usage through partial etchant recycling, minimal damage to devices that have copper metallization, and faster etching process speed.

BRIEF SUMMARY OF THE INVENTION

In one embodiment of the invention a system for decapsulating a portion of an encapsulated integrated circuit that includes copper elements is provided, comprising one or more containers holding specific etchant solutions, a pump having an inlet port connected to the one or more containers holding specific etchant solutions, an outlet port, a temperature-controlled metal block having a fluid inlet connected to the pump outlet port, and an outlet port from the block, and control circuitry enabling control of temperature of the metal block and operation of the pump, and flow and temperature sensors coupled to the control circuitry. Etchant temperature at the outlet of the metal block is controlled to be at or below ambient temperature by controlling the pump and temperature of the metal block, and etchant mixture is delivered via a delivery conduit to an encapsulation surface of an encapsulated integrated circuit, decapsulating a portion of encapsulated circuit, minimizing damage to the copper elements.

In one embodiment the system further comprises one or more spent-etchant passages proceeding from the encapsulation surface where the etchant mixture is delivered, the spent-etchant passages conducting etchant mixture and products of etching away from the encapsulation surface.

In one embodiment the system further comprises at least one waste etchant container and a heat exchanger, wherein the spent-etchant is returned through the heat exchanger to the waste etchant container at substantially ambient temperature. Also in one embodiment the system further comprises an etch head in an etch plate, enabled to support the encapsulated integrated circuit in a manner to expose the encapsulation surface to the etchant delivered, and a safety cover sealable to the etch plate forming an etchant chamber.

In one embodiment the system further comprises a vertically-translatable ram enabled to hold the encapsulated integrated circuit to the etch head. Also in one embodiment the etch plate supports a plurality of etch heads such that different specific etch heads are made available to be used to provide for exposure of different areas of encapsulation on different encapsulated integrated circuits. Also in one embodiment the vertically-translatable ram is driven by gas pressure provided by electrically operated valves controlled from the control circuitry. Also in one embodiment the pump is a diaphragm pump driven by pressurized gas from a reservoir and controlled from the control circuitry. Also in one embodiment the specific etchant solutions comprise one or both of nitric acid and sulphuric acid in a ratio and at the temperature controlled to below ambient temperature to minimize damage to the copper elements of the integrated circuit.

DETAILED DESCRIPTION OF THE INVENTION

The present invention relates to a method and automated system for decapsulating plastic-packaged ICs, achieved using fuming nitric acid, fuming or concentrated sulfuric acid, or a mixture thereof, at a controlled temperature. Embodiments of the invention pertain more particularly to selective application of the etchant or mixture to the encapsulated device, particularly to an epoxy-encased device, in order to provide access to the device or chip for internal inspection, test and repair without damage to the copper, gold or aluminum wires connecting the semiconductor device to the electrical interconnects of the package.

The invention has particular application in decapsulation of packaged IC or semiconductor devices which use the more recent copper technology in connections, electrical interconnects and chip metallization. The combination in one embodiment of the invention of a high concentration of nitric acid and a high concentration of sulfuric acid is particularly effective because the ways in which these two acids remove copper are different and counteract each other. Thus, in the proper combination and at the proper temperature the copper is only minimally removed during the process of encapsulation mold compound removal. This is better understood with respect to the following description.

Figure 1:
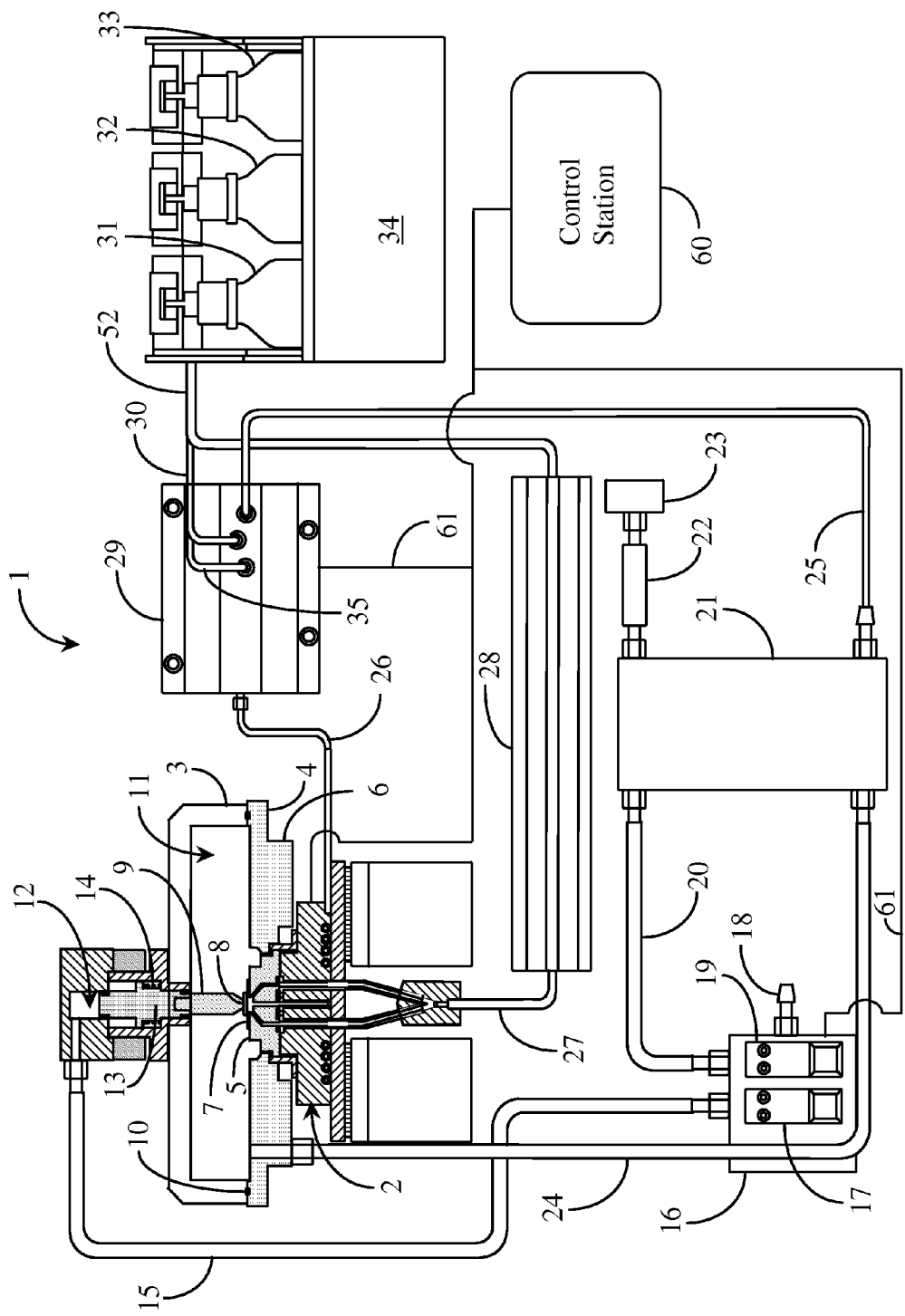
FIG. 1 is a schematic diagram of a decapsulation system which may be used to implement a system and method according to embodiments of the invention.
Figure 2:
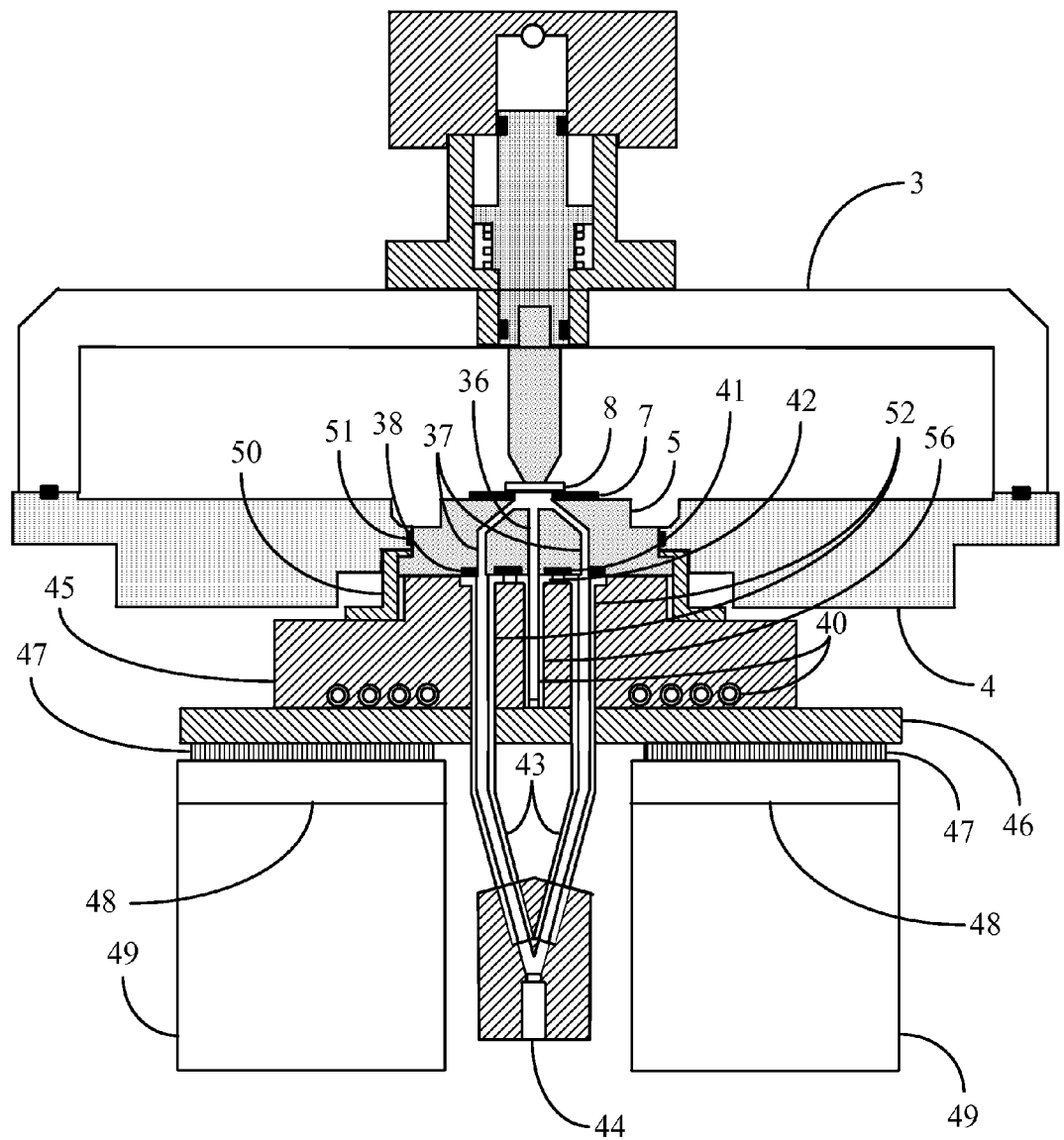
FIG. 2 is an enlarged detail view of an etch head assembly and heat exchanger of the decapsulation system of FIG. 1.
Figure 3:
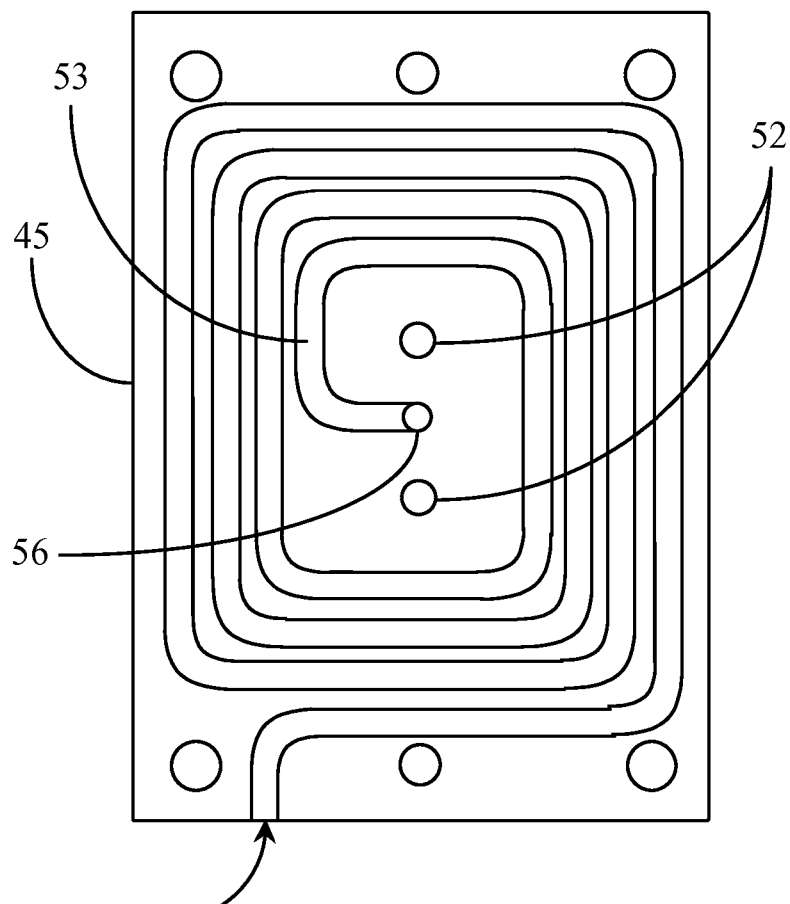
FIG. 3 is a plan view of a heat exchanger block of the heat exchanger of FIG. 2.
Figure 4:
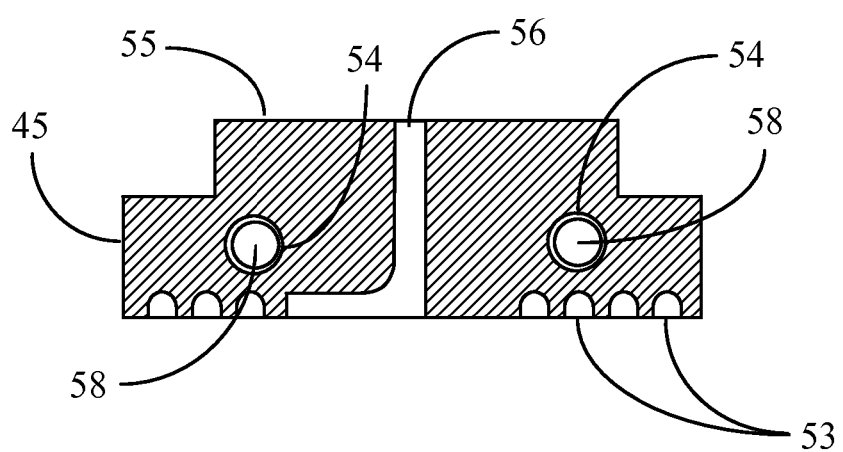
FIG. 4 is a cross-section view of the heat exchanger block of FIG. 3.

FIG. 1 illustrates a decapsulation system which may be used to implement a system and method in accordance with a preferred embodiment of the present invention. FIG. 2 illustrates in greater detail an etch plate and etchant heat exchanger assembly in accordance with the system of FIG. 1, and FIGS. 3 and 4 illustrate an etchant heat exchanger block in accordance with the heat exchanger assembly of FIG. 2.

In the following detailed description of the present invention, numerous specific details are set forth in order to provide a thorough understanding of the invention. However, it will be apparent to the skilled artisan that the present invention may be practiced without all of these specific details. In other instances, well-known methods, procedures and components are not described in detail in order to avoid unnecessarily obscuring description of the new and novel aspects of the invention. Further, references to FIGS. 1-4 may be made alternatively in the following description.

Referring to FIG. 1, system 1 includes apparatus for selectively etching an encapsulant of resinous material surrounding an electronic device, and generally comprises an etching assembly 2 including an etch plate 4, etch head 5, a removable cover 3 forming an etching chamber, etchant solution sources, a diaphragm dispensing pump for delivering high-velocity pulses of liquid transporting etchant from the etchant sources, a heat exchanger 6 for heating and cooling the transported etchant, conduits for transporting spent etchant to a waste vessel, and a waste heat exchanger for returning spent etchant to near ambient temperature. General functionality of the above apparatus is provided below.

An automated acid system 34 provides for storage of source etchant as well as waste etchant. Acid system 34 comprises a plurality of source acid and waste acid containers. In this example bottles 31 and 32 are source bottles, and bottle 33 is a waste bottle. In other embodiments acid system 34 may be equipped with more than two source bottles, as well as more than one waste bottle, and may also be enhanced with an automatic diverter valve (not shown) which, after device package decapsulation, may feed waste etchant into one or another waste bottle that is selected automatically based on acid selection or acid mix ratio that may be programmed into the system. However, a preferred embodiment of the present invention utilizes only one waste etchant vessel as is further described below.

Source etchant is transported to the etching portion of the system by a pump 29, which is connected to acid system 34 by etchant supply tubes 30 and 35, which in this example, are conduits for etchant acids from source bottles 31 and 32. Pump 29 in a preferred embodiment is diaphragm dispensing electric pump capable of delivering precise, high-velocity micro-metered etchant pulses, and is activated by gas pressure, receiving pressurized nitrogen or other gas from a low-pressure reservoir 21 via tube 25.

Pump 29 is capable of selecting between the two source lines 30 and 35 for each delivery cycle, allowing for creation of various mix ratios between etchants or delivering only a single selected etchant. The rapid, high-pressure pulse delivery of each quantity of etchant causes mixes to be homogenous by shear mixing in a heat exchanger (detailed further below) as well as in an etchant-resistant heat exchanger tube 26 which connects between an outflow port of pump 29 and a heat exchanger of the etch head assembly. Shear mixing of the etchant creates turbulence in the etched cavity formed on the exterior surface of the device package encapsulant by reaction of the etchant with the resinous encapsulating material. The turbulence provides for removal of non-reactive elements of the encapsulating resin from the etch face resulting in exposure of more of the reactive material, which provides for faster etching. Pump 29 is also capable of withdrawing etchant from the etched cavity to again deliver the etchant with high-velocity pulses. Such partial recycling of the etchant reduces etchant usage while maintaining delivery of high-velocity etchant pulses at a high rate of speed.

Pump 29 in one embodiment is enhanced with capability of real-time mixing of etchants within the volume of the pump thus eliminating the need for a mixing reservoir, and the operator is able to initiate a decapsulation process with only one acid etchant, stop the process and switch to a second acid or acid mix, or if necessary switch to additional mix ratios. The operator may thereby be given complete interactive control of each step of the etching process.

Block 60 represents a control station comprising inputs for an operator to adjust various variable functions of pump 29, such as selection of source bottles for acid, mixture ratio in case of two or more acids provided simultaneously, pulse variables, and the like, through control cabling 61. Such control elements and interfaces may be accomplished in any of several ways known in the art.

System 1 has an etch head assembly 2 including an etch plate 4, etch head 5 supported by etch plate 4 and a safety cover 3. As is further detailed below with reference to FIGS. 3 and 4, a unique and advantageous heat exchanger assembly 6 is also incorporated which provides a serpentine of etchant-resistant tubing or passages encased in an aluminum block. The aluminum block also comprises electric heaters embedded within, and is in contact with other thermo-electric modules that can either heat or cool the aluminum block. An electronic control mechanism controlled from station 60 through cabling 61 operates the heaters and thermo-electric modules to maintain the aluminum block at a constant temperature, which may be varied from station 60, and thus the temperature of the etchant moving through the serpentine tubing. The need for an auxiliary external etchant heating sources is thus eliminated. The temperature can be controlled from well below ambient temperature; i.e., less than 15 degrees C., to well above the boiling point of the etchant; i.e., more than 250 degrees C. Spent waste etchant is moved through a waste heat exchanger (see FIG. 1, element 28) which returns the spent etchant to near ambient temperature. Although as described above with reference to acid system 34 of FIG. 1 that more than one waste etchant bottle may be utilized in some other embodiments, a preferred embodiment of the invention uses only a single waste etchant bottle (33) allowed by the waste etchant being returned to near ambient temperature by waste etchant heat exchanger 28, so as the single waste vessel receives waste etchant of various mix ratios and from etch processes run at different temperatures, depending on the requirements of the etching process application.

Etch head assembly 2 may in some embodiments incorporate a replaceable etch head insert so that the operator may readily exchange inserts for different decapsulation requirements. For example, different etch heads may be utilized depending on the acid flow required to expose certain portions of the packaged device in the right order, such as early die and first bond exposure, wherein it is preferable to have a central and concentric dispersion of heated acid moving across the package surface. Or in other cases, examination of peripheral components or a large die may be required which would necessitate a peripheral acid flow. By utilizing exchangeable etch heads the limits of the area of the package which is to be etchant-attacked is greatly expanded.

Safety cover 3 may be attached to etch plate 4 by clamps (not shown) or other secure attachment apparatus known in the art. Safety cover 3 is removable by a mechanism (not shown) such as a pivot apparatus, for example, such that access to the encapsulated device package 8 and gasket or seal 7 is provided for positioning on the etch head 5. When safety cover 3 is in place a gasket or seal 10 seals cover 3 to etch plate 4 creating a sealed etch chamber 11.

With cover 3 secured in place, a ram nose 9 is driven toward the encapsulated device package 8 by pressurizing chamber 12 which forces ram 13 down against ram return spring 14, thereby securely holding device package 8 to be decapsulated against the top surface of etch head 5 and seal 7. Ram nose 9 thereby securely clamps device package 8 to seal 7 creating a seal between seal 7 and etch head 5. FIG. 2 illustrates in greater detail the etch head assembly with heat exchanger and related system components, and is referenced alternatively in the following description.

The pressurizing of chamber 12 is caused by pressured nitrogen supplied through tube 15 from valve plate 16. An electrically-operated valve 17 on valve plate 16, controlled from station 60, activates to allow pressurized nitrogen from nitrogen source 18 to flow through tube 15 in order to pressurize chamber 12. When valve 17 is not activated the pressure in tube 15 and chamber 12 is vented to the environment. An additional electrically-operated valve 19 on valve plate 16 activates to allow pressurized nitrogen to flow from source 18 through tube 20 to a low-pressure reservoir 21. Pressure in reservoir 21 is measured by a pressure transducer 23 connected to reservoir 21 by tube 22. An electronic control system opens valve 19 to allow for nitrogen flow from source 18 to chamber 21 when the measured pressure in chamber 21 drops below a specific pressure and turns valve 19 off when the measured pressure is above specific but higher pressure. Pressure in reservoir 21 is thereby maintained within a specific range that is less than the pressure of the nitrogen source 18. Low pressure reservoir 21 is connected to etch plate 4 by tube 24 which is ported to chamber 11 through a bore in etch plate 4.

Etch head 5, being manufactured of material that is both resistant to high and low temperatures and to all combinations of acids used in the etching process, is supported by etch plate 4 and device package 8 mountable to etch head 5 as described above. Etch head 5 is directly in contact with etchant heat exchanger assembly 6 and possesses passages for communicating fresh etchant from the heat exchanger to the device package 8, as well as for communicating spent waste etchant to waste heat exchanger 28 and ultimately to waste bottle 33 of acid system 34. Etch head 5 has an etchant source passage 36 and two spent etchant passages 37 (see FIG. 2). Referring to FIG. 2, etch head 5 is clamped to heat exchanger 45 by a retainer ring 50 and sealed to etch plate 4 by an "O" ring 51.

FIG. 2 provides an enlarged and more detailed view of the etch plate, heat exchanger and etch head assembly and of the decapsulation system of FIG. 1. Some of the elements shown in FIG. 2 have also been illustrated and previously described in FIG. 1 and their element numbers and description have therefore been omitted in the following description to avoid redundancy. The inventors provide FIG. 2 so that the unique and patentable aspects of the invention can be better illustrated and understood.

Etch plate 4 has safety cover 3 in place and sealed to the upper surface using gasket or seal 10 creating etch chamber 11 (FIG. 1). Etch head 5 is clamped to a heat exchanger block 45 using retainer ring 50 and sealed to etch plate 4 by "O" ring 51. Packaged device 8 to be decapsulated is securely held in place with the downward pressure of ram nose 9 (FIG. 1) and sealed to the upper surface of etch head 5 with seal 7.

Heat exchanger block 45 has a central bore 56 which accommodates passage of source etchant from a serpentine heat exchanger tube 40 embedded within heat exchanger block 45, to etchant source passage 36 of etch head 5. An extension of heat exchanger tube 40 passes up through central bore 56 and has a flange 42 at the upper end and is sealed to etch head 5 communicating with source passage 36 of etch head 5 and sealed by "O" ring 41. Heat exchanger block 45 also has a pair of bores 52 which accommodate waste tubes 43 for passage of waste etchant from waste passages 37 of etch head 5.

Referring back to FIG. 1, pump 29 transports etchant from source bottles 31 and/or 32 through supply tubes 30 and 35 to the heat exchanger tube 26 which communicates with the serpentine heat exchanger tube 40 embedded within heat exchange block 45. In the heat exchanger assembly the source etchant assumes a temperature near to that of heat exchanger 6. This temperature is monitored and controlled from electronic control station 60 at the desired value, which may be lower than ambient, such as 10 degrees C., for decapsulating packaged devices utilizing copper interconnect wires or copper metallization on the chip. The temperature may also be maintained above the boiling point of the etchant, such as 250 degree C., for decapsulating devices that do not contain copper or other such sensitive materials.

Each delivery of a volume of etchant agitates the etchant in contact with the packaged device 8 and forces some portion of the etchant contained in the cavity etched into device 8 into the waste passages 37 in etch head 5. Waste passages 37 are sealed to the flanges on the end of the waste tubes 43 by "O" rings 38. The waste etchant passes through etch head 5 into waste tubes 43 and waste junction 44 where the flow from both tubes is combined and passes into waste tube 27 (FIG. 1). Waste tube 27 is clamped into a finned heat exchanger 28 (FIG. 1) which returns the waste etchant to near ambient temperature, and the waste etchant may then be transported to waste bottle 33 (FIG. 1) via waste tube 52.

FIG. 3 is a plan view of heat exchanger block 45 of the heat exchanger of FIG. 2 showing the arrangement of internal passages. Bores 52 pass through block 45 and accommodate passage of waste tubes 43 (FIG. 2). Block 45 also has a central bore 56 which accommodates passage of source etchant to etch head 5 through an extension of serpentine heat exchanger tube 40 (FIG. 2). A spiral groove 53 is machined into the face of block 45 and is designed to accommodate serpentine heat exchanger tube 40 (FIG. 2). Tube 40 has an inlet 57 which communicates with heat exchanger tube 26 leading from an outflow fitting of pump 29 (FIG. 2).

FIG. 4 is a cross-section view of the heat exchanger block of FIG. 3. In this view spiral grooves 53 are shown extending in from the surface of block 45. Cross drillings 54 extend through block 45 and accommodate electric heating elements 58 therein, as is detailed further below. Heat exchanger block 45 has an upper face 55 which in practice of the invention is directly in contact with etch head 5, as shown in FIG. 2.

Heat exchanger block 45 in manufactured in a preferred embodiment of aluminum, and in practice of the invention, is fitted with a pair of electric heating elements 58 that are placed within cross drillings 54. Source etchant passes from pump 29 (FIG. 1) through heat exchanger tube 26 which also extends through heat exchanger block 45 by being placed within spiral grooves 53 (FIGS. 3, 4) machined into the face of block 45. A cover plate 46 clamps tube 26 into place (FIG. 1). As tube 26 is in direct contact with heat exchanger block 45 and cover 46, there is significant heat transfer through the wall of heat exchanger tube 26 to the etchant passing through tube 26.

Referring now back to FIG. 2, opposite to the heat exchanger block and beneath and in direct contact with cover 46 are a pair of thermoelectric assemblies 47 each of which, when activated by an electronic control system will transfer heat from cover 46 to a heat sink assembly comprised of a plate 48 and a plurality of fin plates 49 by a process well known to those skilled in the art. An airflow provided by an electrically-operated fan (not shown) is directed across the numerous fin plates thereby cooling the fin plates to near ambient temperature. By controlling the level of electrical activation of the thermoelectric assemblies 47, the electronic control system (not shown) can control the temperature of the heat exchanger block 45 and cover 46 at a level well below ambient temperature.

As the etch head 5 is directly in contact with the upper face 55 of the heat exchanger block 45, the etch head 5 and etchant are at nearly the same temperature as the heat exchanger block 45 and cover 46. By activating the electric heating elements 58 which are placed within cross drillings 54 of FIG. 4, the temperature of the heat exchanger block 45, cover 46, etch head 5 and the etchant itself can all be raised collectively above ambient temperature. The temperature is monitored by the electronic control system and the power to activate the electric heating elements 58 within cross drillings 54 of heat exchanger block 45 is adjusted to maintain the desired temperature. If the temperature of the heat exchanger block 45 is above the desired process temperature, the electric heating elements 58 are automatically turned off and the thermoelectric elements 47 are activated. If the temperature of the heat exchanger block 45 is below the desired process temperature, the thermoelectric heating elements 47 are turned off and the electric heating elements 58 are turned on. In the present invention the electronic control system is a proportional integral derivative controller (PID controller); however, other control systems may be used without departing from the scope and spirit of the invention.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative manner rather than a restrictive case, and all such modifications are intended to be included within the scope of the invention.

Benefits, other advantages and solutions to problems have been described above with regard to specific embodiments. However, the benefits, advantages, solutions to problems and any other element(s) that may cause any benefit, advantage or solution to occur or become more pronounced are not to be construed as critical, required or essential features or elements of any or all of the claims. As used herein, the terms "comprises", "comprising" or any variation thereof, are intended to cover non-exclusive inclusion, such that a process, method, article or apparatus that comprises a list of elements does not include only those elements but may include other elements not expressly listed or inherent to such processes, method, article or apparatus.

Thus, the scope of the present disclosure is to be determined by the broadest permissible interpretation to the maximum extent allowed by law, of the following claims, and shall not be restricted or limited by the foregoing detailed description.

What is claimed is:

1. A system for decapsulating a portion of an encapsulated integrated circuit that includes copper elements, comprising:
   one or more containers holding specific etchant solutions;
   a pump having an inlet port connected to the one or more containers holding specific etchant solutions, and an outlet port;
   a heat exchanger assembly comprising a temperature-controlled metal block having a fluid inlet into the metal block connected to the pump outlet port, and an outlet port from the metal block, and serpentine passages communicating from the fluid inlet, through the metal block, to the outlet port;
   one or more thermo-electric modules in contact with the metal block of the heat exchanger assembly, the thermo-electric modules operable to either heat or cool the metal block;
   control circuitry controlling operation of the one or more thermo-electric modules, thereby controlling temperature of the metal block, and also controlling operation of the pump; and
   flow and temperature sensors coupled to the control circuitry;
   wherein etchant temperature at the outlet of the metal block is controlled by operation of the one or more thermo-electric modules, to be at or below ambient temperature, and etchant mixture at or below ambient temperature is delivered via a delivery conduit to an encapsulation surface of an encapsulated integrated circuit, decapsulating a portion of encapsulated circuit, minimizing damage to the copper elements.

2. The system of claim 1 further comprising one or more spent-etchant passages proceeding from the encapsulation surface where the etchant mixture is delivered, the spent-etchant passages conducting etchant mixture and products of etching away from the encapsulation surface.

3. The system of claim 1 further comprising at least one waste etchant container and a heat exchanger, wherein the spent-etchant is returned through the heat exchanger to the waste etchant container at substantially ambient temperature.

4. The system of claim 1 further comprising an etch head in an etch plate, enabled to support the encapsulated integrated circuit in a manner to expose the encapsulation surface to the etchant delivered, and a safety cover sealable to the etch plate forming an etchant chamber.

5. The system of claim 4 further comprising a vertically-translatable ram enabled to hold the encapsulated integrated circuit to the etch head.

6. The system of claim 5 wherein the vertically-translatable ram is driven by gas pressure provided by electrically operated valves controlled from the control circuitry.

7. The system of claim 4 wherein the etch plate supports a plurality of etch heads such that different specific etch heads are made available to be used to provide for exposure of different areas of encapsulation on different encapsulated integrated circuits.

8. The system of claim 1 wherein the pump is a diaphragm pump driven by pressurized gas from a reservoir and controlled from the control circuitry.

9. The system of claim 1 wherein the specific etchant solutions comprise one or both of nitric acid and sulphuric acid in a ratio and at the temperature controlled to below ambient temperature to minimize damage to the copper elements of the integrated circuit.

* * * * *